United States Patent [19]
Hubbell

[11] Patent Number: 5,600,242
[45] Date of Patent: Feb. 4, 1997

[54] ELECTRICALLY SMALL BROADBAND HIGH LINEAR DYNAMIC RANGE DECEIVER INCLUDING A PLURALITY OF ACTIVE ANTENNA ELEMENTS

[75] Inventor: Stephen P. Hubbell, Gig Harbor, Wash.

[73] Assignee: The Boeing Company, Seattle, Wash.

[21] Appl. No.: 313,506

[22] Filed: Sep. 26, 1994

[51] Int. Cl.$^6$ .......................... G01R 33/02; G01R 33/035
[52] U.S. Cl. .......................... 324/248; 324/244; 324/260; 505/846
[58] Field of Search .................. 324/244, 247, 324/248, 260; 505/845, 846; 128/653.1; 333/995; 326/5; 327/510, 527

[56] References Cited

U.S. PATENT DOCUMENTS

| | | | |
|---|---|---|---|
| 4,151,601 | 4/1979 | Verhulst | 365/8 |
| 4,323,983 | 4/1982 | Lee et al. | 365/8 |
| 4,432,069 | 2/1984 | Rose et al. | 365/8 |
| 4,454,522 | 6/1984 | de Lozanne | 357/5 |
| 4,814,706 | 3/1989 | Rempt | 324/244 |
| 4,904,940 | 2/1990 | Rempt | 324/244 |
| 4,906,929 | 3/1990 | Rempt | 324/244 |
| 5,134,117 | 7/1992 | DiIorio et al. | 505/1 |
| 5,187,327 | 2/1994 | Ohta et al. . | |
| 5,194,807 | 3/1993 | Ueda | 324/248 |
| 5,326,986 | 7/1994 | Miller, Jr. et al. | 324/248 X |
| 5,373,383 | 12/1994 | LaGasse | 359/161 |
| 5,467,015 | 11/1995 | Gotoh . | |

FOREIGN PATENT DOCUMENTS

| | | | |
|---|---|---|---|
| 0301301 | 11/1992 | Germany | 324/248 |
| 0050975 | 2/1989 | Japan | 324/248 |
| 0298878 | 12/1990 | Japan | 324/248 |
| 0116477 | 4/1992 | Japan | 324/248 |
| 0160380 | 6/1992 | Japan | 324/248 |
| 0204069 | 7/1992 | Japan | 324/248 |

OTHER PUBLICATIONS

R. Welty et al., "Two–State Integrated SQUID Amplifier with Series Array Output," NIST Cryogenics, maunscript received Aug. 24, 1992, pp. (?).

R. Welty, et al., "A Series Array of DC Squids," IEEE Transactions On Magnetics, vol. 27, No. 2, Mar., 1991, pp. 2924–2926.

N. Welker, et al., "A Superconductive H–Field Antenna System," Laboratory for Physical Sciences, College Park, Maryland, (journal unknown), (publ. date unknown) pp. 183–187.

S. Wolf, et al., "Superconducting Extremely Low Frequency (ELF) Magnetic Field Sensors for Submarine Communications;" IEEE Trans. On Communications, vol. Com–22, No. 4, Apr. 1974, pp. 549–554.

J. Davis, et al., "Development of a Superconducting ELF Receiving Antenna," IEEE Trans. on Antennas and Propagation, vol. AP–25, No. 2, Mar. 1977, pp. 223–231.

M. Nisenoff, "The Use of SQUIDs in Low–Frequency Communication Systems," AIP Conf. Proc., vol. 44, 1978, pp. 117–129.

(List continued on next page.)

*Primary Examiner*—Gerard R. Strecker
*Attorney, Agent, or Firm*—John C. Hammar

[57] ABSTRACT

A magnetic field sensor which can be used as an active antenna is disclosed that is capable of small size, ultrawideband operation, and high efficiency. The sensor includes a multiplicity of magnetic field transducers, e.g., superconducting quantum interference devices (SQUIDs) that are electrically coupled in a serial array. Dummy SQUIDs may be used about the perimeter of the array, and electrically coupled to the active SQUIDs for eliminating the edge effects on the active SQUIDs. A magnetic flux transformer may be used in combination with a feedback assembly for increasing the sensitivity and linear dynamic range of the active antenna.

31 Claims, 9 Drawing Sheets

OTHER PUBLICATIONS

K. Stawiasz, et al., "Noise Measurements of Series SQUID Arrays," EEE Trans. on Applied Superconductivity, vol. 3, No. 1, Mar. 1993, pp. 1808–1811.

R. hansen, "Fundamental Limitations in Antennas," Proc. of the IEEE, vol. 69, No. 2, Feb. 1981, pp. 170–182.

R. Dinger et al., "Adaptive Methods for Motion–Noise Compensation in Extremely Low Frequency Submarine Receiving Antennas," Proc. of the IEEE, vol. 64, No. 10, Oct. 1976, pp. 1504–1511.

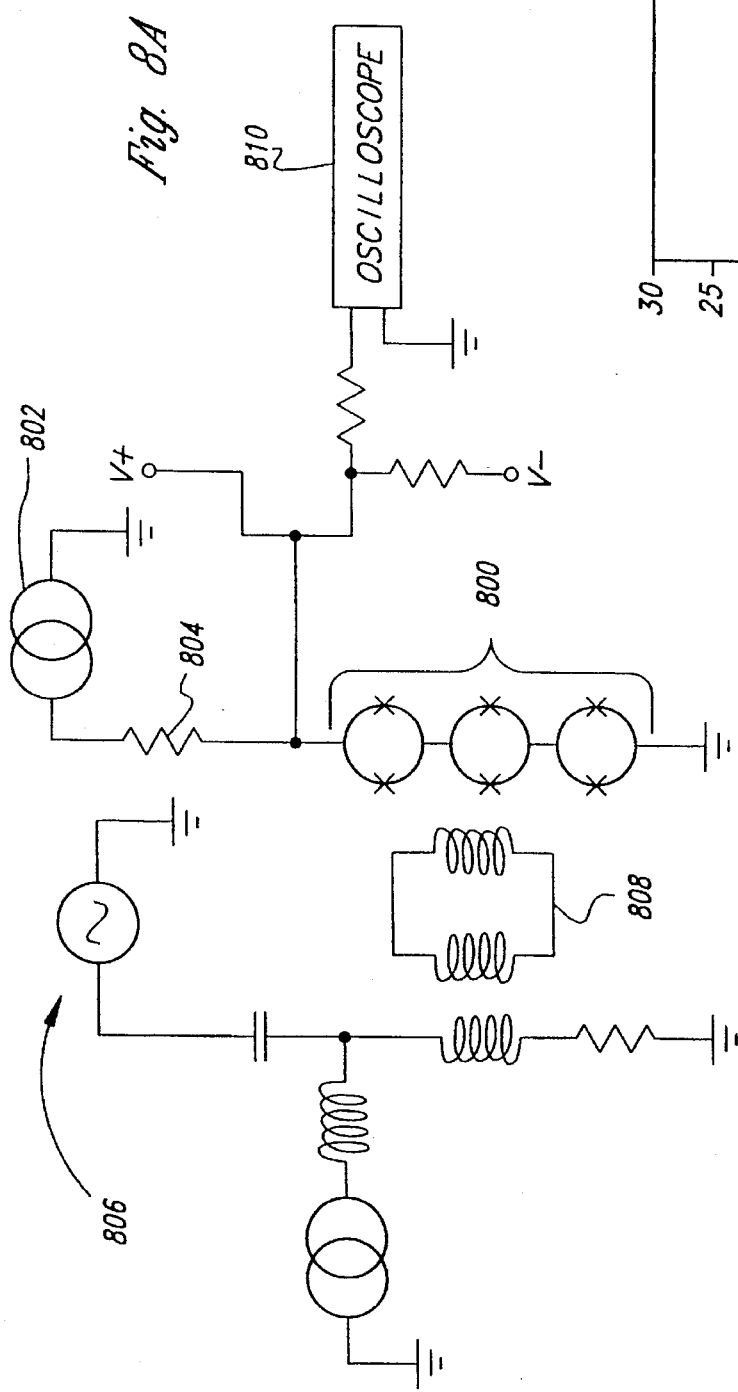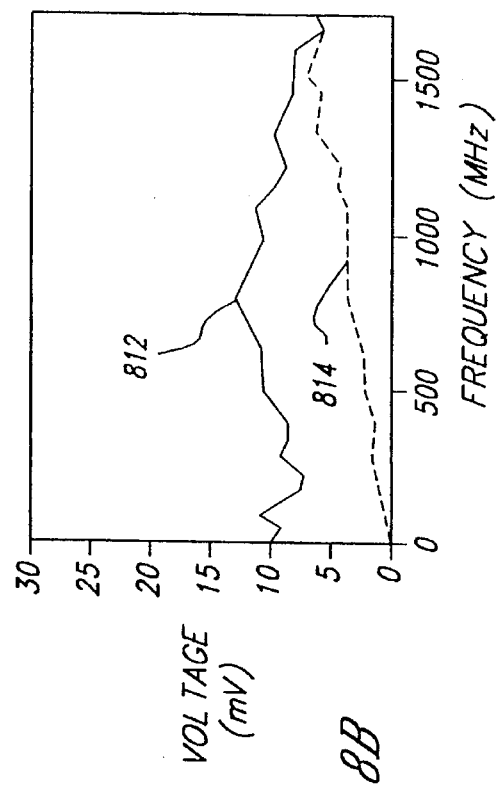

ELECTRICALLY SMALL BROADBAND HIGH LINEAR DYNAMIC RANGE DECEIVER INCLUDING A PLURALITY OF ACTIVE ANTENNA ELEMENTS

TECHNICAL FIELD

The present invention is an electrically small, ultrawideband, high dynamic range active antenna for receiving energy from an electromagnetic field.

BACKGROUND OF THE INVENTION

Antennas for receiving energy produced by electromagnetic radiation are well known. Conventional antennas are primarily detectors for sensing the electric field component of the electromagnetic radiation. Typically, in conventional antennas the electric field component of the electromagnetic radiation induces a voltage in the antenna when resonant. A conventional antenna is referred to as "electrically small" if its size is less than one-quarter of the wavelength of the electromagnetic radiation to be received. The utility of these antennas is directly related to the wavelength of the electromagnetic radiation, the size of the antenna, and other known loss factors of the antenna. Attempts to construct an efficient, electrically small, antenna have met with several obstacles.

Generally, the size of conventional antennas is tuned to about one-quarter of the wavelength of the electromagnetic radiation to be received. Typically these antennas (i.e., dipoles) have bandwidths of less than 20% of their resonant frequency for useful operation. Larger bandwidths can be obtained with the so-called "frequency independent" antennas (i.e., equiangular spirals), however, even they tend to have maximum bandwidths of about 10:1 (i.e., 2–18 GHz). Here the bandwidth is set by the size of the antenna being $\lambda/3$ at the lower end of the band and by the electrical size of the antenna feed on the high end of the band. In either case, the size of conventional antennas places at least a lower limit on the frequency of electromagnetic radiation that can efficiently be received. Also, the size of an efficient, low frequency antenna can be prohibitive for most platforms, consequently, efficiency is often sacrificed to make them smaller. For example, a $\phi_0$dBi antenna for detecting 1 MHz signals would have to be 400 feet in diameter.

Another obstacle to constructing an electrically small conventional antenna is that a reduction in the size of the antenna generally results in a corresponding reduction in its bandwidth. This is due to the sensitivity of a conventional antenna being a strong function of the wavelength of the received electromagnetic radiation. In other words, the bandwidth is determined by the fact that electrically small antennas must be resonant in order to effectively and efficiently absorb power from the incident energy. Since electrically small antennas also have a small impedance as seen at the antenna feed, this means that additional methods for achieving resonance will be narrow band.

Still another obstacle associated with conventional antenna systems is the limited linear dynamic range of any preamplifiers connected to the passive antenna. Typically semiconductor preamplifiers have about a 100 dB linear dynamic range in the power output of the amplified signals over a 1 Hz bandwidth. In many applications this dynamic range, along with the associated sideband level increase (due to nonlinearities), is unacceptable. Quite often linear dynamic range requirements of over 130 dB may be required in a 1 Hz bandwidth.

Further, since the efficiency of conventional antennas is reduced with their size, noise and other inherent losses become more important when post-processing the induced signal. The increased reduction in efficiency for small antennas is an unavoidable consequence of the low radiation resistance compared to resistive losses of the antenna. Still further inefficiency for small antennas can result from any impedance mismatch between the antenna impedance and the feed line impedance which is typically 50 ohms.

For these reasons, it has been difficult, if not impossible, to produce an electrically small, wide bandwidth, high sensitivity antenna with an amplifier that has a large dynamic range.

These results are further exacerbated when supergain or superdirectivity principles are applied to conventional small antennas. Superdirectivity refers to the ability of an electrically small antenna to have the same antenna pattern as an electrically larger antenna. Superdirectivity is typically obtained by producing a phased array of closely spaced conventional antennas. For traditional phased arrays the spacing of the elements is typically less than one half wavelength at the highest operating frequency. Consequently, the size of the antenna element will determine the phased array bandwidth. For superdirective arrays with even smaller inter-element spacing the size of each antenna becomes even more important. Furthermore, all of the previously described inefficiencies exist along with further reductions in the antenna efficiency due to the strong mutual coupling between the plurality of closely spaced antenna elements. Consequently, superdirectivity arrays are inefficient and impractical when constructed with conventional antenna technology.

Still other attempts to provide an electrically small, high bandwidth antenna have employed superconducting quantum interference devices (SQUIDs) as the preamplifier for an antenna. Nancy K. Welker et al., "A Superconductive H-Field Antenna System," Laboratory for Physical Sciences, College Park, Md. ("the Welker article"). FIG. 2 of the Welker article provides a schematic illustration of the manner in which the SQUID preamplifier is coupled to the antenna in an attempt to improve the bandwidth and sensitivity of an electrically small antenna. Although the proponents of the system maintain that they improve the bandwidth and sensitivity of small antennas, this approach nonetheless suffers from some of the same disadvantages of the conventional antenna systems discussed above. For example, the pickup loop used is inherently narrow band due to its size and method of construction (i.e., the use of resistors and capacitors). Furthermore, they used a single inefficient RF biased SQUID which in part resulted in a much larger pickup loop and reduced linear dynamic range.

Accordingly, it is desirable to provide a small antenna capable of wideband operation. It is further desirable to provide a small antenna capable of wideband operation that is efficient and has a large linear dynamic range. It is further desirable to provide an antenna that is not limited to detecting the electric component of electromagnetic radiation but rather produces an output signal in response to the magnetic field component.

SUMMARY OF THE INVENTION

The present invention is a sensor for detecting the magnetic component of the incident electromagnetic radiation. The sensor includes a plurality of interconnected magnetic field transducing elements each for providing electrical energy indicative of the magnitude of the magnetic component of the incident electromagnetic radiation. The array is constructed to combine the electrical energy provided by each of the elements. The antenna also includes a bias circuit, coupled to the array, for providing bias current to the plurality of magnetic field transducing elements.

In an alternate embodiment of the invention, a portion of the magnetic field transducing elements are tunnel junction elements that are arranged in a multidimensional array. The antenna also includes a plurality of dummy tunnel junction elements electrically coupled to the tunnel junction elements and positioned at the array perimeter. The plurality of dummy tunnel junction elements are constructed to ensure that all the active tunnel junction elements receive equal magnetic flux from the applied electromagnetic field.

In still another embodiment of the invention, a magnetic flux transformer (focuser) is provided for collecting the magnetic flux provided by the magnetic component of the electromagnetic radiation and for providing the collected magnetic flux to the plurality of magnetic field transducing elements for linear dynamic range and sensitivity enhancement. A simple and compact feedback assembly is responsive to the plurality of magnetic field transducing elements for providing feedback to the magnetic flux transformer. The magnetic flux transformer is responsive to the feedback for maintaining the magnetic flux provided to the plurality of magnetic field transducing elements at a substantially predetermined level for additional dynamic range enhancement. The result of these improvements is an electrically small, ultrawideband, high dynamic range sensor with high sensitivity.

BRIEF DESCRIPTION OF THE DRAWINGS

FIG. 8A is a schematic of a sensor used to gather test data for the invention.

FIG. 8B shows a graph of the output voltage response with respect to frequency of the magnetic field for the test apparatus of FIG. 8A.

DETAILED DESCRIPTION OF THE INVENTION

The present invention is an active sensor for responding to the magnetic component of incident electromagnetic radiation. In accordance with the present invention, the sensor can be constructed to be extremely small, e.g., 4 mm×4 mm, and yet provide ultrawideband operation, (i.e., DC to greater than 10 GHz). Furthermore, the sensor can be constructed to provide a high dynamic range (i.e., the maximum to minimum detectable magnetic field ratio of at least 124 dB for a less than −60 dB sideband level) and still maintain a high efficiency. These characteristics are obtained by constructing a sensor with a flux transformer or focuser for sensitivity enhancement along with an array of magnetic field transducers which by themselves can be used to multiplicitively increase sensitivity or be used to increase the linear dynamic range through dispersal of the applied magnetic flux over many SQUIDs. In addition, the use of a negative magnetic flux feedback circuit, or low frequency filtering with magnetic shielding, can be used to increase the linear dynamic range of the sensor.

Figure 1:
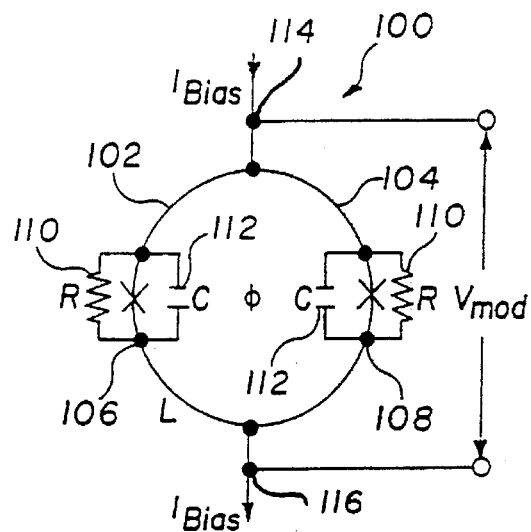
FIG. 1 is an illustration of a superconducting quantum interference device (SQUID) that is used as the magnetic field transducing element of the subject invention.

The magnetic field transducing element of the presently preferred embodiment of the invention is a device having Josephson tunnel-junctions such as, for example, a superconducting quantum interferometric device (SQUID). An example of a DC-SQUID 100 is illustrated in FIG. 1 which includes first and second DC current paths 102 and 104, each having a respective Josephson tunnel-junction 106 and 108. As is conventional in the art, each Josephson tunnel-junction 106 and 108 is illustrated schematically as including a resistance 110 and a capacitance 112.

Advantageously, the sensors described herein can be used as antennas. The electrically small, ultrawideband, high dynamic range characteristics of the sensors eliminates all of the drawbacks of conventional antennas, as discussed above. However, the sensors described herein can be used for many other magnetic or electric field sensing applications.

In FIG. 1, the SQUID device 100 is shown to be DC current biased, i.e., to receive a constant current $I_{bias}$ at its input 114. As is further known in the art, DC SQUID devices are constructed so that they conduct current that includes a superconducting current component as well as a normal current component. With reference to the DC SQUID 100, in the absence of an applied magnetic field, the superconducting current component that is conducted in path 102 will be in phase with the superconducting current component that is conducted in path 104. In the presence of an applied magnetic field $\phi$, the relative phase of the superconducting current component conducted in paths 102 and 104 will be altered, thereby changing the manner in which the superconducting current components are combined at the output node 116 of the DC SQUID 100. However, since the total current conducted through the DC SQUID 100 is constant, the change in the manner that the superconducting current components are combined will be compensated by a respective complementary change in the magnitude of the normal current component. The increase or decrease in the magnitude of the normal current component will provide a modulated output voltage $V_{mod}$ across the DC SQUID 100, wherein the modulated output voltage will be indicative of the applied magnetic field. This relationship is illustrated in the performance graphs 118 and 120 of FIG. 2.

Figure 2:
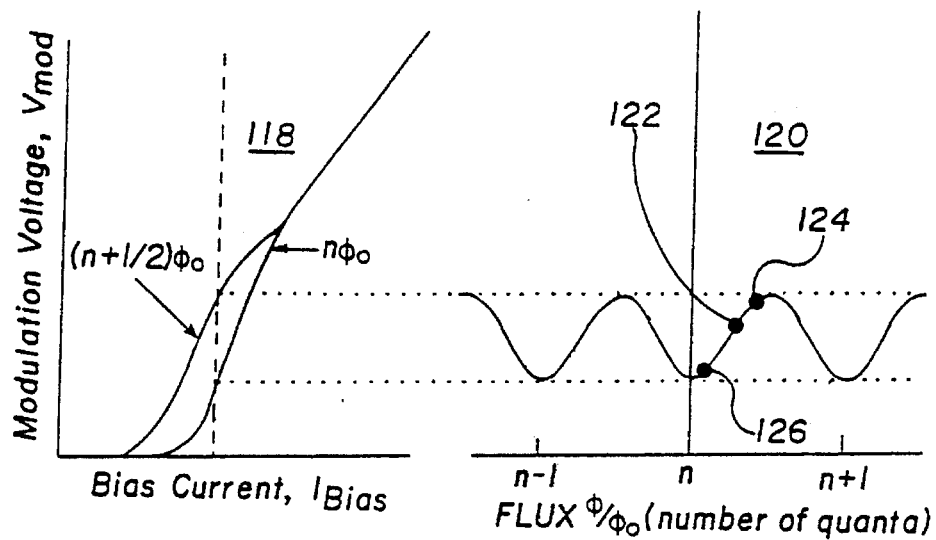
FIG. 2 illustrates the voltage versus current and voltage versus flux relationships for the SQUID illustrated in FIG. 1.

Referring to FIG. 2, graph 118 represents the relationship between the modulation voltage and the bias current for two applied magnetic flux levels, i.e., $n\phi_0$ and $(n+\frac{1}{2})\phi_0$. Where $\phi_0$ is a standard unit equal to $2.07\times10^{-15}$ Webers. The curve on graph 118 for the applied flux $(n+\frac{1}{2})\phi_0$ represents a phase difference between the superconducting current components in paths 102 and 104 of ±180°. The phase difference between the superconducting current components in paths 102 and 104 of the curve for the applied flux $n\phi_0$ is 0° or ±360°.

As a result, when a constant bias current is applied, the output voltage is a periodic voltage that varies with changes in the applied magnetic flux, as shown in graph 120 of FIG. 2. In graph 120, the applied magnetic flux $\phi$ has been normalized by dividing by the standard unit $\phi_0$. The applied flux is referred to as integral multiples of the normalized flux, i.e., $\phi=n\phi_0$. Graphs 118 and 120 thus illustrate that the output voltage of the DC SQUID 100 is periodic for a constant bias current and varying applied flux.

The sensitivity of SQUIDs is directly related to the flux collection area over which the magnetic field is detected, e.g., larger SQUIDs or SQUIDs with flux transformers (focusers) are more sensitive. Conventional SQUIDs are typically very small or inefficient and are typically used for measuring levels between $10^{-5}$ and $10^{-9}$ gauss. For antenna operation, even greater sensitivity to electromagnetic fields is required. Since the ambient magnetic noise floor can be as low as $10^{-13}$ gauss, sensitivities on the order of at least $2\times10^{-13}$ gauss are desirable. Accordingly, for antenna operation, it is necessary to improve the sensitivity of the SQUIDs.

Figure 3:
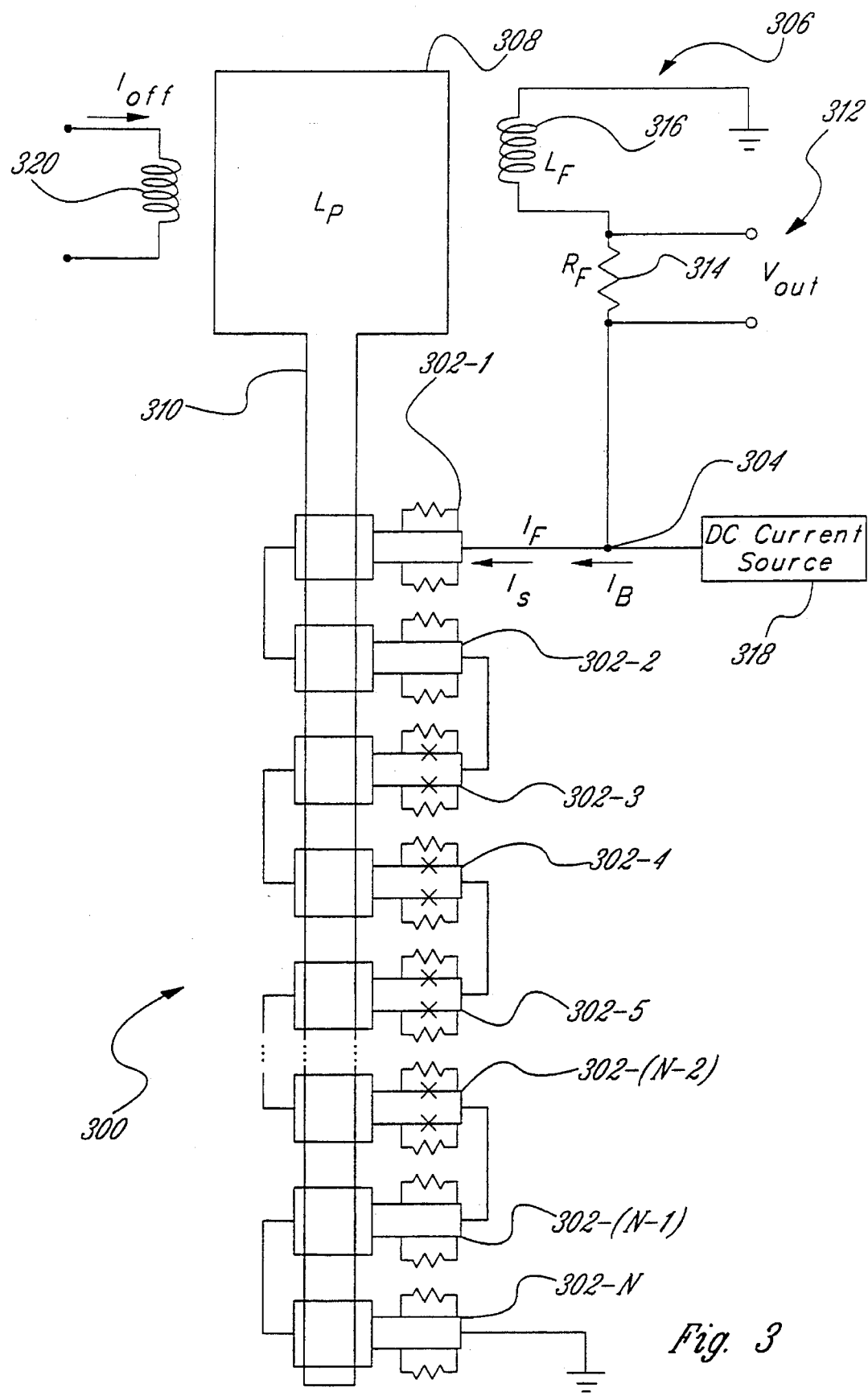
FIG. 3 is an illustration of a sensor constructed in accordance with the subject invention and including a feedback assembly.

To achieve this sensitivity, a sensor 300, in FIG. 3, is provided and constructed from a plurality of DC SQUID devices 302-1 through 302-N that are coupled in a serial array and constructed to receive DC current from an input node 304. The "dummy" SQUID elements 302-1, 302-2, 302-(N-1) and 302-N have the same metal geometry as the "active" SQUIDs 302-3 through 302-(N-2) but do not have tunnel junctions. Although two dummy elements are shown on each end, we could have used one dummy element or more than two dummy elements. A magnetic flux collecting assembly 306 includes a large area coil 308 electrically coupled to a small area coil 310. The small area coil is inductively coupled to the plurality of DC SQUID devices 302-1 and 302-N. The magnetic flux collecting assembly 306 acts as a flux focuser, to collect incident magnetic flux and focus the flux upon the plurality of SQUIDs 302-1 through 302-N. In the embodiment illustrated in FIG. 3, the small area coil 310 is configured in an elongated strip so that the plurality of DC SQUID devices 302-1 through 302-N are linearly positioned therealong, thereby constructing a linear array. However, it should be apparent to those skilled in the art, that the small area coil may be constructed in a variety of configurations for inductive coupling with the plurality of SQUID devices.

The dummy elements ensure that the active elements (i.e., DC SQUIDS) behave in the same manner by being subjected to a common electromagnetic environment, as will be explained in greater detail with respect to the embodiment illustrated in FIG. 5.

The large area coil 308 is provided for collecting the magnetic flux to be detected by the plurality of active DC SQUID devices 302-3 through 302-(N-2). To improve the sensitivity of the sensor 300 and to increase the flux collection area, the coil 308 is constructed of a substantially large area, in comparison to the area of the small area coil 310. Those skilled in the art will recognize that the combination of the large area coil and the small area coil performs the function of a magnetic flux transformer, i.e., transforming the magnetic flux collected over the large area of the large area coil 308 to the smaller area of the small area coil 310.

In a sense, the large area coil 308 functions as a lens to concentrate the magnetic field on the small area coil 310. Many alternative configurations for the flux collection assembly 306 will readily become apparent to those skilled in the art. For example, the large area coil 308 could be multiple coils connected in parallel to the terminals of the small area coil 310, to form a fractional turn coil. As another example, resistors and/or capacitors can be used in series with the large area coil 308 for filtering. Other examples will readily become apparent to those skilled in the art.

The sensor 300 also includes a feedback assembly 312 that is electrically coupled to the plurality of DC SQUID devices 302-1 through 302-N at the input node 304. The feedback assembly 312 further includes a resistor 314 coupled to the input node 304 in parallel with the plurality of DC SQUID devices 302-1 to 302-N. The second lead of the resistor 314 is coupled to ground through an inductor 316. The inductor 316 is inductively coupled to the large area coil 308 thereby to provide feedback to the magnetic flux collecting assembly 306. A current source 318 is constructed to provide a constant current to the input node 304. Accordingly, the feedback assembly 312 is responsive to the plurality of DC SQUID devices 302-1 through 302-N for providing negative magnetic flux feedback to the large area coil 308 thereby to reduce the magnetic flux provided to the small area coil 310 and, hence, reduce the number of the plurality of DC SQUID devices 302-1 through 302-N that are required for a high linear dynamic range. Alternatively, the feedback magnetic flux could also be inductively coupled directly to the small area coil 310 for substantially maintaining the total flux at a predetermined level.

Figure 3A:
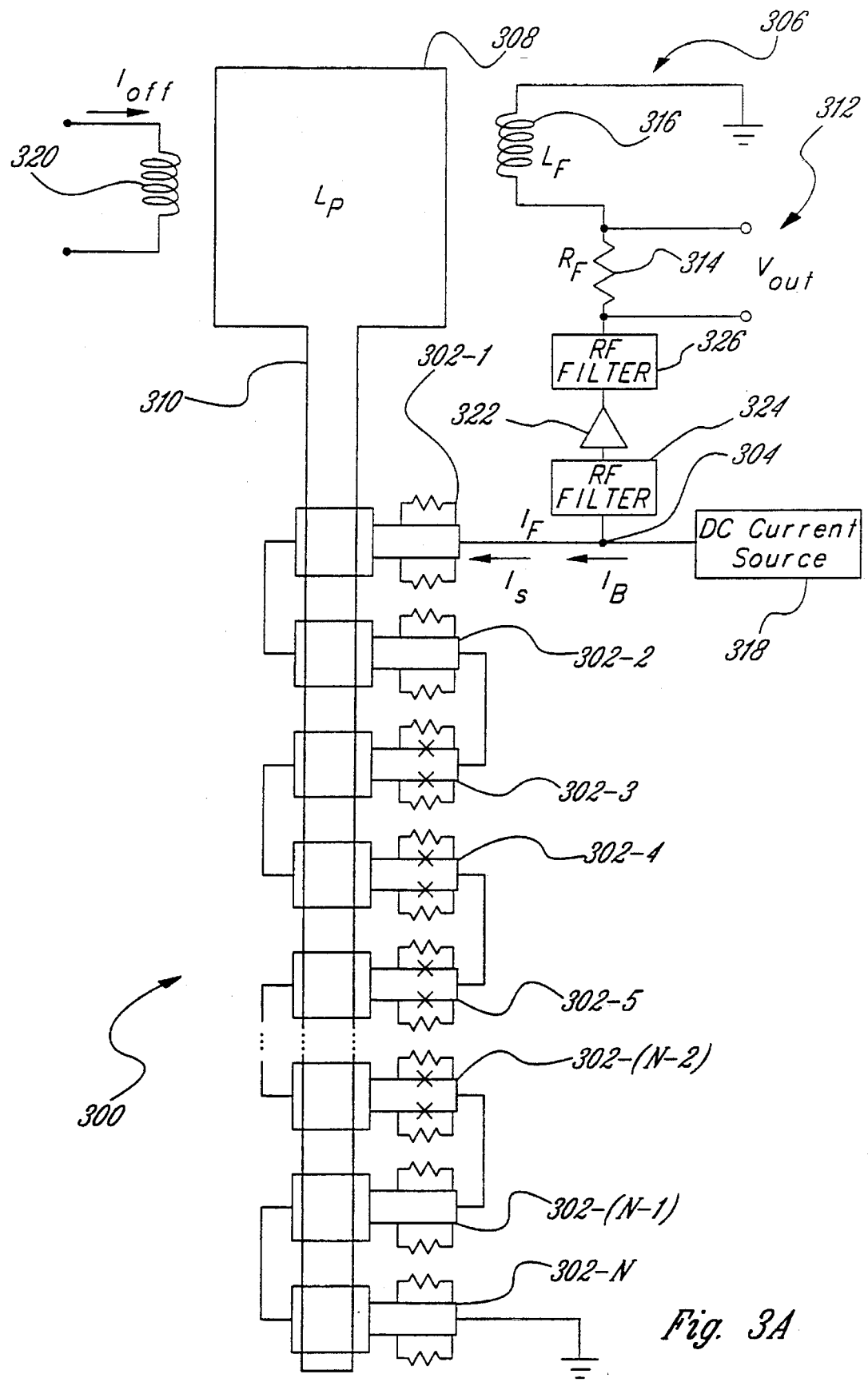
FIG. 3A is an illustration of an alternative embodiment of the sensor illustrated in FIG. 3.

As still another alternative for increasing the linear dynamic range of the sensor 300, an amplifier 322 can be coupled in series with first and second RF filters 324 and 326, respectively, and the combination coupled in series with the input node 304 and the resistor 314, as illustrated in FIG. 3A. The alternative embodiment of FIG. 3A can also be used with direct inductive coupling to the small area coil 308, as described above. Preferably, the amplifier 322 is a low noise amplifier. The amplifier 322 enhances the gain of the feedback assembly 312, thereby increasing the dynamic range of the sensor 300. The RF filters may be either high pass or low pass and are provided for eliminating undesirable frequencies that may induce instability in the feedback circuit.

An inductor 320 is coupled to a constant current source to provide a biasing magnetic flux to the large area coil 308. More particularly, with reference to graph 120 of FIG. 2, the inductor 320 is constructed to provide adequate magnetic flux to the large area coil 308 so that in the absence of an applied magnetic field $\phi$, each DC SQUID device 302-3 through 302-(N-2) will be operating at voltage flux position 122. The gain of the negative feedback assembly 312 is preferably constructed so that the plurality of DC SQUID devices will operate within the active range of the voltage versus flux characteristics of the DC SQUID illustrated in FIG. 2, between a maximum output voltage indicated at point 124 and a minimum output voltage indicated at point 126.

As illustrated in FIG. 3, the output voltage $V_{out}$ of the antenna is measured as the voltage across the resistor 314 although the voltage could also be measured across the resistor 314 and inductor 316. Alternatively, the output voltage can be measured across the plurality of DC SQUID devices 302-1 through 302-N, e.g., from the input node 304 to ground. The advantage of the alternative configuration is that the feedback assembly 312 is required to work over a lower frequency range. As a result, phase delays due to circuits of appreciable electrical length are not a problem.

Figure 4:
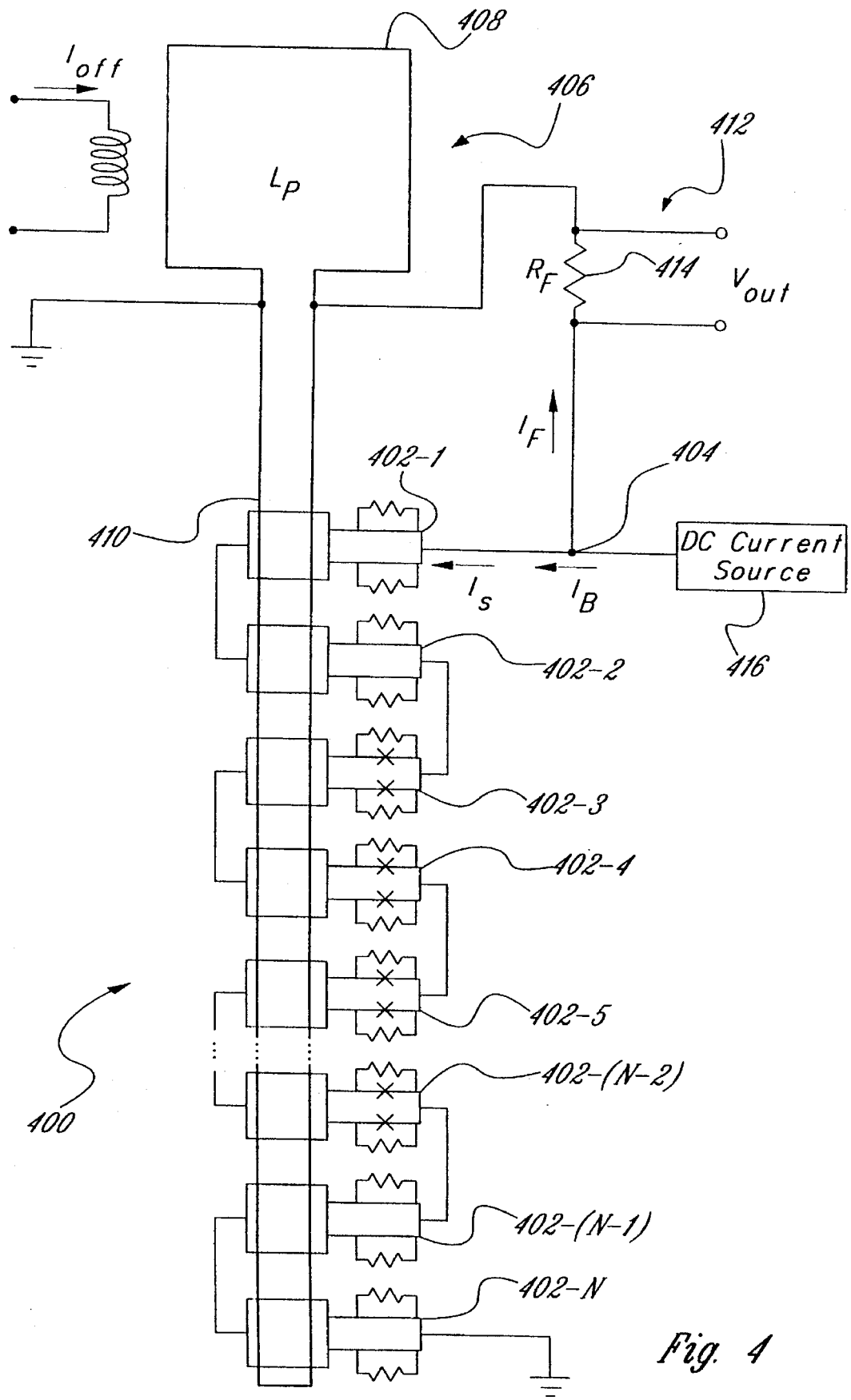
FIG. 4 is an illustration of a sensor constructed in accordance with the present invention and including an alternative embodiment of a feedback assembly.

An alternative embodiment of the sensor is illustrated in FIG. 4. A sensor 400 includes a plurality of DC SQUID devices 402-1 through 402-N that are serially coupled between an input node 404 and ground. The first and last two or more devices should be "dummy" SQUIDs which do not have tunnel junctions. A flux collecting assembly 406 includes a large area coil 408 and a small area coil 410 wherein the large area coil is electrically coupled to the small area coil 410 and wherein the small area coil 410 is inductively coupled to the plurality of DC SQUID devices 402-1 through 402-N.

A feedback assembly 412 is also provided and coupled to the plurality of DC SQUID devices 402-1 through 402-N at the input node 404. Like the feedback assembly 312 illustrated in FIG.3, the feedback assembly 412 is constructed to minimize the variation in the magnetic flux provided to the small area coil 410 thereby to increase the overall linear dynamic range of the plurality of DC SQUID devices 402-3 through 402-(N-2). Unlike feedback assembly 312, the feedback assembly 412 is not constructed to provide magnetic flux to the large area coil 408. Instead, the feedback assembly 412 includes a resistor 414 having a first lead coupled to the input node 404 and a second lead electrically coupled to the small area coil 410 for providing electrical energy, e.g., current, to the small area coil. DC current source 416 provides a constant current to the input node 404 so that modulation in the voltage at the node 404, relative to ground, will provide a similar modulation in the feedback current $I_f$, which modulation can be monitored by the voltage drop across the resistor 414 to provide the output of the active sensor 400. Similarly, like the sensor 300, the output of the sensor 400 can also be measured across the plurality of SQUID devices 402-1 through 402-N.

As discussed above by reference to the sensor 300 of FIG. 3, the large area coil 408 could be constructed from multiple coils and can be used in combination with filtering resistors and capacitors. Further, as discussed by reference to FIG. 3A, a serial combination of an amplifier with RF filter can be coupled in series with input node 404 and the resistor 414 to improve the gain of the feedback assembly 412, thereby increasing the dynamic range of the sensor 400.

The advantage of the antennas 300 and 400 is that the sensitivity of the sensor is improved well beyond that typically available for single DC SQUID devices. The arraying of a plurality of DC SQUIDs permits a larger dynamic range for the sensors 300 and 400 than would be available with a single SQUID. Also, the feedback circuit serves to further enhance the linear dynamic range of the sensor. Although the sensors 300 and 400 illustrated in FIGS. 3 and 4 have been shown and described by reference to eight illustrated DC SQUID devices, many DC SQUID devices could be provided to improve the overall dynamic range of the sensor. The inventor presently envisions 100 or more DC SQUID devices being provided for the sensors illustrated in FIGS. 3 and 4. These circuits may be used for low frequency (i.e., <1 MHz) or high frequency (i.e., >1 MHz) feedback depending on the configuration of the feedback network.

Figure 5:
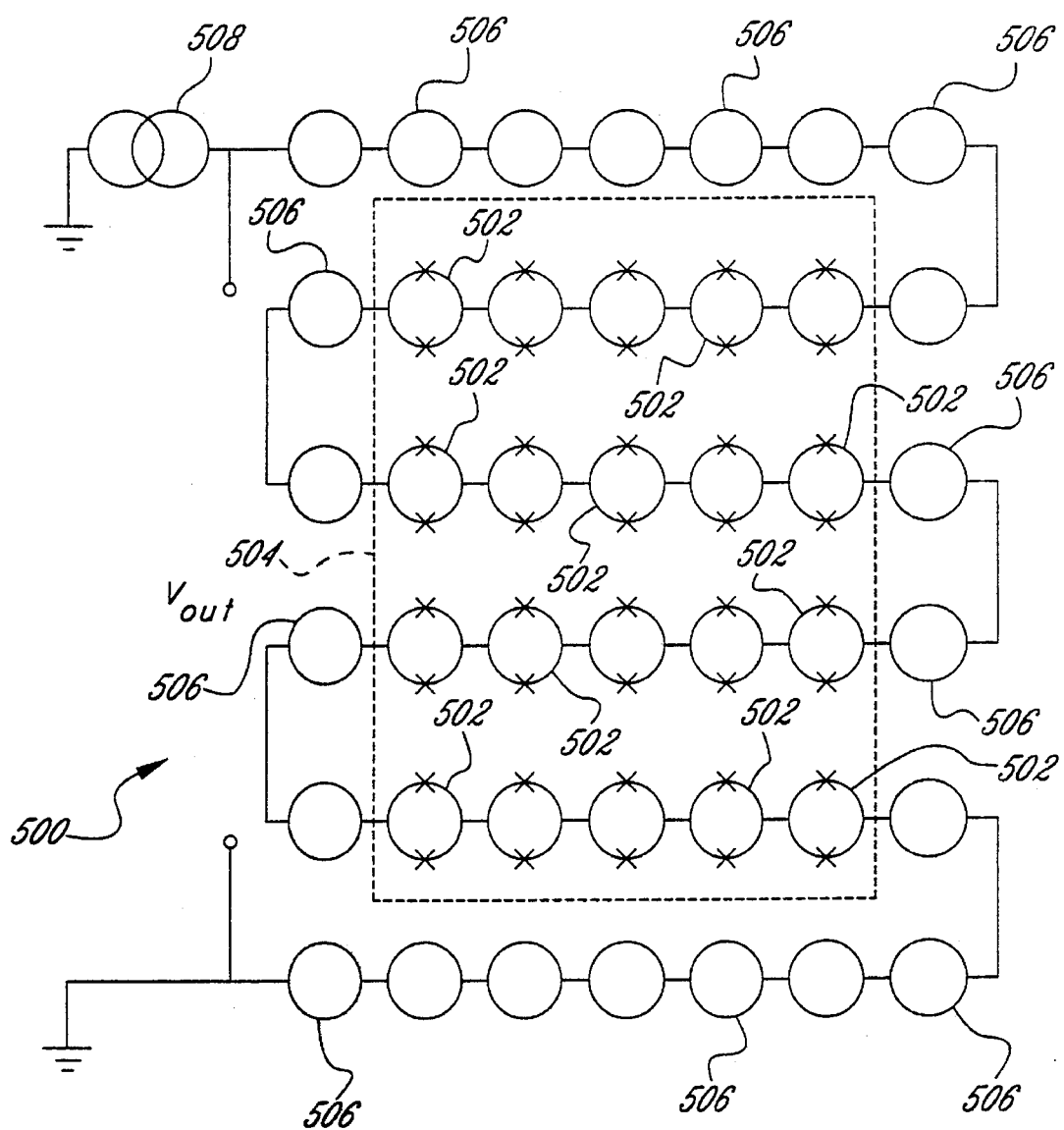
FIG. 5 is a schematic diagram of an alternative construction of the subject invention employing a plurality of SQUIDs for direct detection of an electromagnetic field.

Another alternative embodiment of the invention is illustrated in FIG. 5. Therein, a sensor 500 is constructed from a plurality of serially coupled DC SQUID devices 502. The plurality of DC SQUID devices 502 are positioned in a two-dimensional array defining a perimeter 504. Although the array illustrated in FIG. 5 is a two-dimensional array, the invention can be constructed with a linear array or a multidimensional array, i.e., two-dimensional array, three-dimensional array, etc.

The output voltage of the sensor $V_{out}$ is measured across the plurality of DC SQUIDs. Like the plurality of DC SQUIDs used in sensors 300 and 400, the plurality of DC SQUIDs in 500 increase the area over which the applied magnetic field can be detected, thereby increasing the sensitivity of the sensor. Also, the additional DC SQUIDs can be used to increase the linear dynamic range of the sensor.

To insure maximum output voltage, $V_{out}$, from the DC SQUID array, it is important that the DC SQUIDs 502 that are close to the perimeter 504 behave in the same manner as the DC SQUIDs that are in the interior of the array. Since the DC SQUIDs conduct currents, they produce small electromagnetic fields. As a result, the interior DC SQUIDs are subjected to a different electromagnetic environment than the DC SQUIDs close to the perimeter. To correct for this effect, a plurality of dummy SQUID devices 506 are electrically coupled to the plurality of DC SQUID devices 502 and positioned about the perimeter thereof to reduce edge effects on the DC SQUID devices 502. The dummy SQUID devices 506 are constructed to perform in the same manner as the active DC SQUID devices 502, i.e., produce electromagnetic fields, with the exception that the electrical output of the dummy SQUID devices is constant and independent of changes in the applied magnetic flux. This is typically achieved through the replacement of the tunnel junctions with short circuits. Accordingly, the DC SQUID devices 502 behave as though they were constructed in an infinite array, and therefore produce a maximum output voltage. The precise number of dummy elements and their location depends upon the geometry of the array which determines the nonuniform magnetic field distribution over the array without dummy elements. The number of active DC SQUIDs is determined by the desired flux to voltage transfer characteristics, linear dynamic range, and output noise impedance for the array.

A current source 508 is coupled to provide a constant current to the serial array of DC SQUID devices 502 and dummy SQUID devices 506. In this embodiment, the voltage generated by the serial array of DC SQUID devices comprises the output of the sensor 500. It is presently believed that the array illustrated in FIG. 5 could be made up of 100 or more DC SQUID devices.

Figure 6:
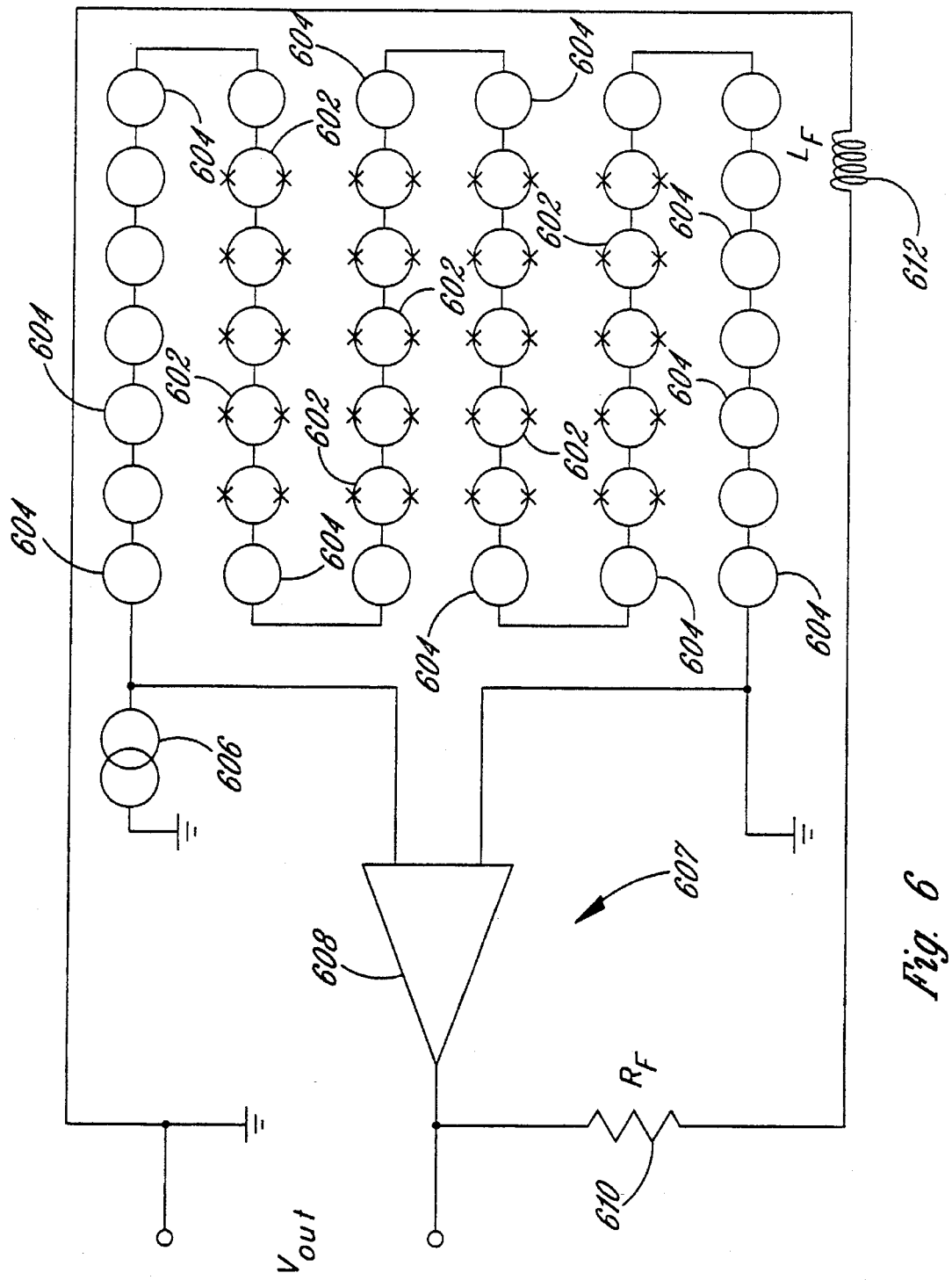
FIG. 6 is a schematic diagram of still another alternative embodiment of the present invention employing a plurality of SQUIDs for direct detection of an electromagnetic field and using an amplifier in series with an inductor and resistor for negative magnetic flux feedback.

FIG. 6 is an illustration of still another embodiment of the DC SQUID sensor that is the subject of the present invention. With reference to FIG. 6, a plurality of DC SQUID devices 602 are constructed in a serial array and include a plurality of dummy SQUID devices 604 positioned about the periphery of the array. A current source 606 is constructed to provide a source of substantially constant current to the serial array of DC SQUID devices 602.

In the embodiment illustrated in FIG. 6, a negative feedback circuit 607 is provided at the output of the serial array. As with sensors 300 and 400, the feedback circuit 607 is provided for amplifying the output voltage of the serial array, thereby to reduce the need of adding DC SQUID devices to increase the linear dynamic range requirements of the sensor. The feedback circuit 607 includes an amplifier 608 having its inputs coupled to the input and output of the array of serial DC SQUID devices 602. The output of the amplifier is coupled to ground through a resistor 610 and an inductor 612. The output of the sensor is measured across the resistor and inductor combination.

Figure 7:
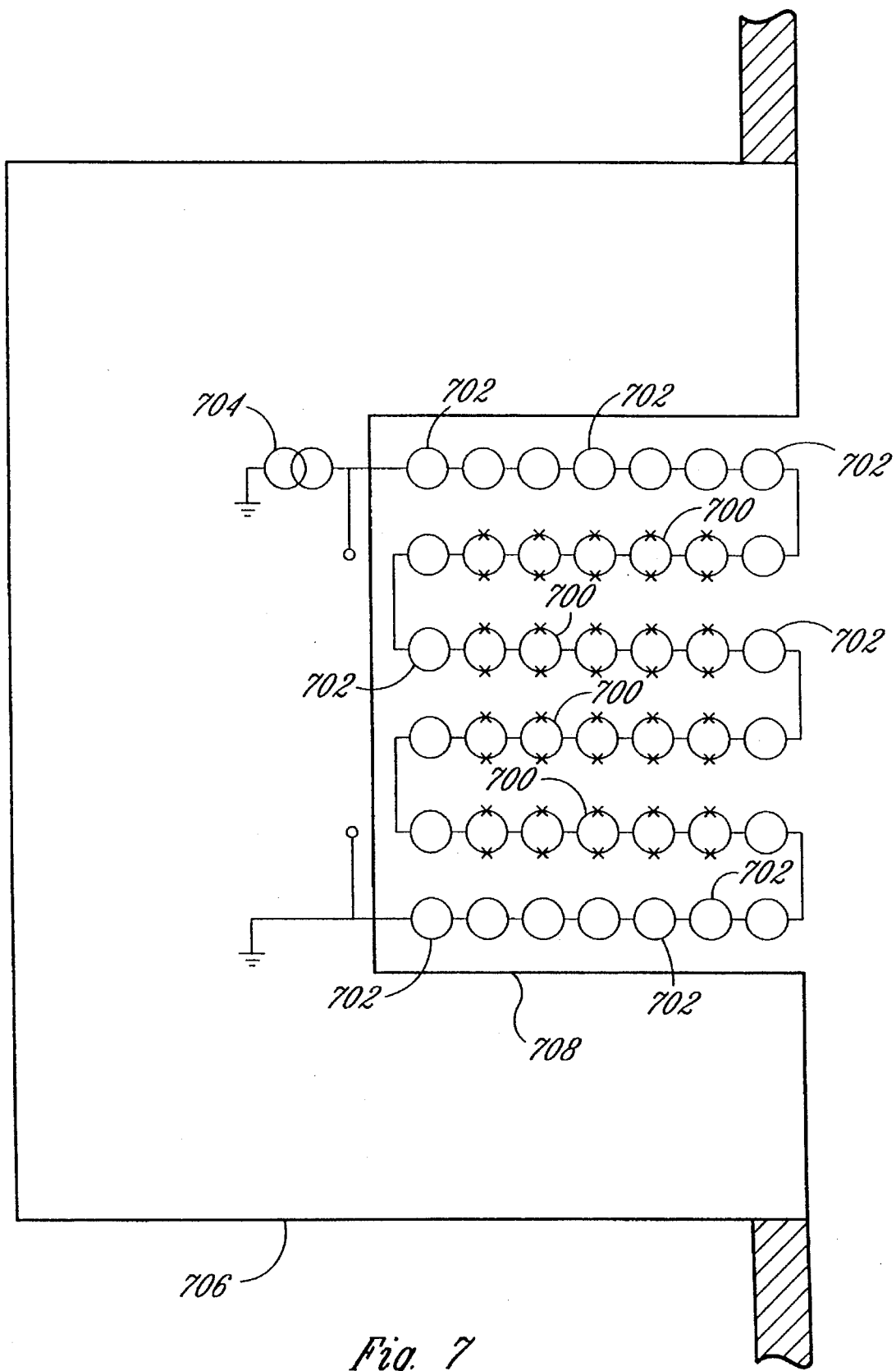
FIG. 7 is a schematic diagram of an alternative embodiment of the invention using a ferromagnetic shielded box and a plurality of SQUIDs.

Still another embodiment of the invention is illustrated in FIG. 7. Therein, a serial array of DC SQUID elements 700 includes a plurality of dummy SQUID devices 702 positioned about their periphery. A current source 704 is coupled, as before, to provide a source of constant current to the serial array of DC SQUID devices.

A magnetic shield 706 encloses the DC SQUID array for suppressing low frequency electromagnetic fields such as the earth's geomagnetic field, thereby substantially reducing or even eliminating the need for a feedback circuit, but yet still allows induced surface circuits on the shield 706 to be coupled to the array through, for example, a conducting ribbon 708 which is nonmagnetic. A slice in the ribbon would allow the DC SQUID array chip to be placed near the surface of the box but not too close as to be influenced directly by the earth's magnetic field. Configurations other than the conducting ribbon could be used to couple induced currents to the array without departing from the spirit of the invention. As mentioned before, the primary advantage of this approach is the reduced need for a negative flux feedback circuit. Also, although the conducting ribbon is shown coupled directly to the SQUID array in FIG. 7, it could be coupled to the array through a large area coil of a flux transformer in the same manner as the collected flux is coupled to the plurality of SQUIDs in the sensor 300 of FIG. 3.

Those skilled in the art will appreciate that although the sensors illustrated in FIGS. 3–7 have been shown and described by reference to DC SQUID devices, any Josephson tunnel-junction type device could be substituted without departing from the true scope of the invention. Moreover, a plurality of transducers for providing electrical energy indicative of an applied magnetic field could be substituted for the DC SQUID devices described herein.

Also, the superconductors used in this invention may be of any low or high temperature type. For example, a good low temperature superconducting material is Niobium or its compounds at 4.2 K. and YBaCuO is a good high temperature superconducting material for 77° K. described herein. Similarly, the Josephson tunnel-junction used may be of any variety, however, superconductor/insulator/superconductor (SIS) or superconductor/normal metal/superconductor (SNS) junctions are appropriate, along with constriction-type junctions known as weak links. Cooling of the elements is provided by conventional means and has not been illustrated so as to simplify the figures and discussion.

The magnetic field sensors described above, and recited in the claims that follow, may be used to effectively achieve an electrically small, ultrawideband, high linear dynamic range, active antenna. The electrically small and ultrawideband nature of the device is achieved through detection of the magnetic field component of electromagnetic radiation, rather than the electric field component, as is done in conventional antennas. The magnetic component is detected with magnetic flux to voltage transducing elements. The high linear dynamic range results from the distribution of the applied magnetic flux over multiple, low noise, transducing elements with negative magnetic flux feedback. The "active" term comes from the use of a DC current bias.

Several prototype SQUID sensors have been constructed in accordance with the foregoing description and tested to determine their performance. Generally, the performance of these prototype SQUID sensors verified the above-described conclusions regarding the characteristics of sensors constructed in accordance with the subject invention.

As one example, a 100-element SQUID sensor was constructed with a DC current bias source similar to that illustrated in FIG. 4. However, instead of a flux focuser constructed like the large area coil 408 of FIG. 4, a fractional turn coil was used. A low-frequency signal source was used in combination with a Helmholtz coil for exciting the test sensor. The output from the sensor was compared with the input to the Helmholtz coil to determine a transfer function for the sensor. The transfer function was determined to be $1.2 \times 10^4$ V/T, which gives a minimum detectable magnetic field of $3.10 \times 10^{-14}$ T. This was very comparable to the predicted minimum detectable field for the test sensor of $3.34 \times 10^{-14}$ T. This confirms that the sensors can be constructed in accordance with the subject invention and that their sensitivity can be accurately predicted. Furthermore, improvements in the sensor construction, e.g., by using an improved flux focuser, will improve the predicted sensitivity of the sensor. Accordingly, these tests confirm that a sensor can be readily constructed having a sensitivity which is limited by the noise floor created by atmospheric and galactic radiation (magnetic fields).

In another test, a 100-element SQUID array 800 having a DC current bias provided by a direct current source 802 and a resistor 804 was constructed, as illustrated in FIG. 8A. The SQUID array was excited using an RF signal input 806 coupled to the SQUID array by a flux transformer 808. The output of the sensor was monitored using an oscilloscope 810. The results of the test are shown in FIG. 8B wherein the output from the SQUID sensor is illustrated by the solid graph 812 and the output with the SQUID array off is illustrated by the dashed graph 814. This test setup provided nearly uniform output voltage for a bandwidth from DC to approximately 1 GHz before appreciable output degradation was found. This test confirmed that sensors constructed in accordance with this invention will have a bandwidth far better than that available with prior art antennas. It is believed that the geometric configuration of the SQUID array contributed to induced EMF currents in it that caused degradation in the output voltage above 1 GHz. Accordingly, by properly selecting the geometric configuration of the array, the bandwidth can be further improved.

Figure 9:
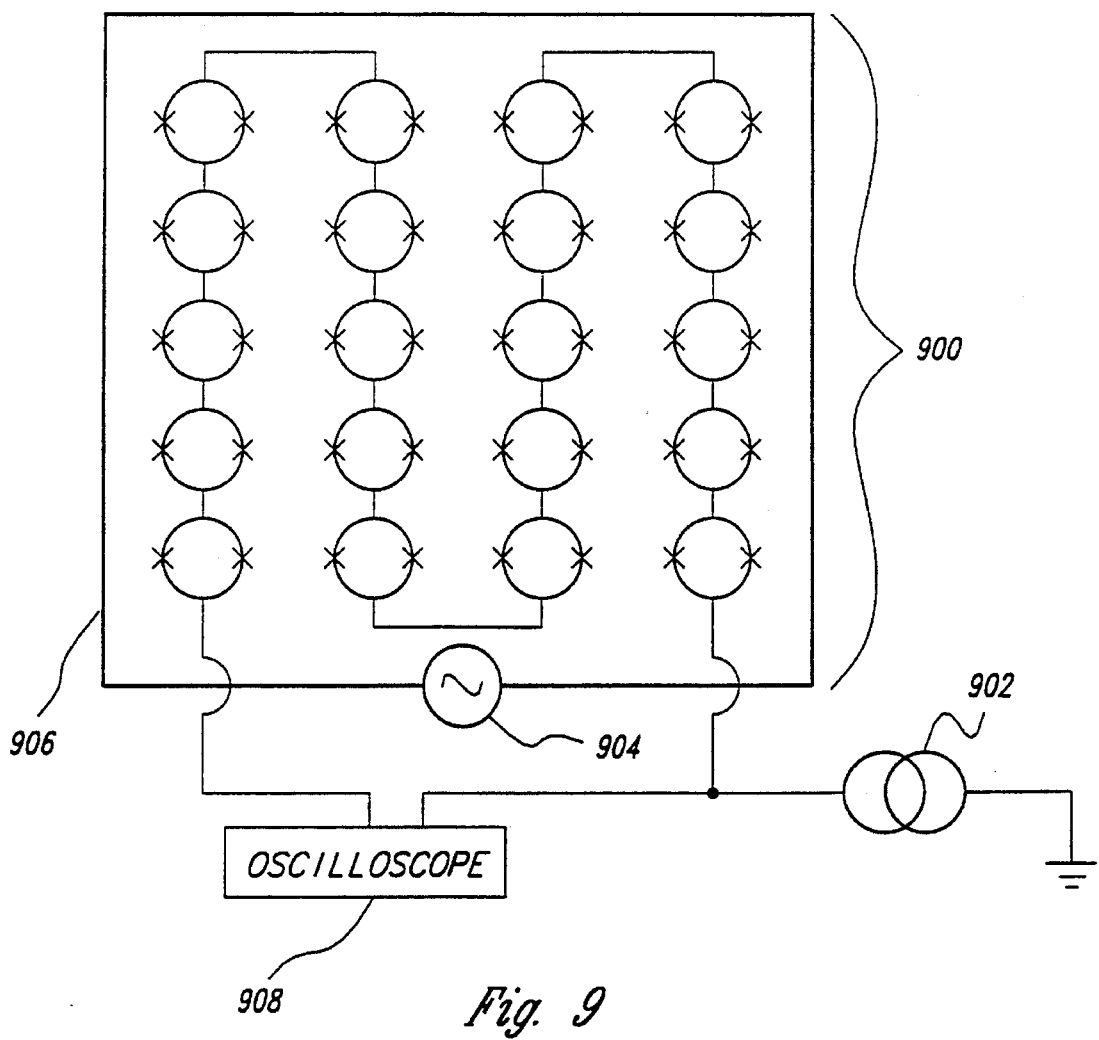
FIG. 9 is a schematic of an alternative sensor used to gather test data for the invention.

In a last test setup, a 7,469-element SQUID array 900 was constructed with a DC source 902 as illustrated in FIG. 9. The SQUID array 900 was configured as a generally square two-dimensional n by k array, i.e., wherein n≅k. The array was excited using an input signal source 904 and a peripheral coil 906. The input and output voltages were measured using an oscilloscope 908. The measurements were analyzed to determine the linear dynamic range of the array in comparison to a single device. The test data showed that the output voltage-to-noise floor ratio was $3.4 \times 10^4$ for a single SQUID while the ratio for the 7,469-element array was $1.53 \times 10^8$. Thus, the additional SQUIDs increased the linear dynamic range by about $10^4$. This test confirmed that the linear dynamic range of the sensor can be improved by increasing the number of SQUIDs used in the sensor.

From the foregoing it will be appreciated that, although specific embodiments of the invention have been described for purposes of illustration, various modifications may be made without deviating from the spirit and scope of the invention. Accordingly, the invention is not limited except as by the appended claims.

I claim:

1. An active antenna apparatus for detecting the magnetic field component of applied electromagnetic radiation comprising:

magnetic field transducing means comprising a plurality of active elements, each active element producing an electrical signal indicative of the magnitude of the magnetic component of the applied electromagnetic field, the active elements being serially coupled together to form an array, the array being constructed to combine the electrical signal from each active element to produce a combined output signal;

bias means, coupled to said array, for providing a constant bias current to each active element of the magnetic field transducing means; and dummy element means, coupled to the array, for ensuring that the applied electromagnetic radiation is substantially the same for each active element of the array so that the combined output signal is indicative of the applied electromagnetic radiation, the dummy element means being responsive to the bias current to create a compensating magnetic field but not being responsive to the applied electromagnetic radiation.

2. The antenna apparatus recited in claim 1 wherein a portion of the active elements comprise tunnel junction elements.

3. The antenna apparatus recited in claim 1 wherein a portion of the active elements comprise superconducting quantum interference devices (SQUIDS).

4. The antenna apparatus as recited in claim 2 wherein the tunnel junction elements are arranged in an array defining an array perimeter, wherein the dummy element means includes a plurality of dummy elements interspersed with and electrically coupled to said tunnel junction elements generally positioned at the array perimeter, each dummy element providing substantially uniform magnetic flux in response to the bias current but being nonresponsive to changes in the applied electromagnetic radiation.

5. The antenna apparatus as recited in claim 4 wherein said array is a multidimensional array.

6. The antenna apparatus as recited in claim 4 wherein said tunnel junction elements and said dummy elements are serially coupled in said array, and wherein the bias means includes current source means for providing the bias current to the array and to the dummy elements.

7. The antenna apparatus as recited in claim 1, further comprising means for collecting magnetic flux provided by the applied electromagnetic radiation and for distributing the collected magnetic flux to each active element of the array.

8. The antenna apparatus of claim 7 wherein the means for collecting magnetic flux includes a magnetic flux transformer having a large area coil coupled to a small area coil, wherein said small area coil is inductively coupled to each active element.

9. The antenna apparatus as recited in claim 2, further comprising magnetic flux input means for collecting magnetic flux from the applied electromagnetic radiation and for providing the collected magnetic flux to each tunnel junction element; and feedback means for adjusting the total magnetic flux provided to said magnetic flux input means in response to the combined output signal from the array.

10. The antenna apparatus as recited in claim 9 wherein said feedback means further comprises:

a current source including an output node electrically coupled to said array;

a resistor having first and second leads, said first lead being electrically coupled to said output node; and an inductor having first and second leads, said first lead of said inductor being electrically coupled to said second lead of said resistor and said second lead of said inductor being coupled to a reference potential, said inductor being inductively coupled to said magnetic flux input means to provide feedback gain.

11. The antenna apparatus as recited in claim 9 wherein said feedback means further comprises:

a current source including an output node electrically coupled to said array; and a resistor having first and second leads, said first lead being electrically coupled to said output node of said current source, said second lead being electrically coupled to said magnetic flux input means.

12. An active antenna apparatus for detecting the magnetic field component of applied electromagnetic radiation wherein the magnetic field component provides an applied magnetic flux, comprising:

a plurality of magnetic field transducing means for producing an electrical signal indicative of and proportional to the magnetic component of the electromagnetic radiation;

magnetic flux pickup means for collecting the applied magnetic flux and for distributing the collected magnetic flux to said plurality of magnetic field transducing means; and analog feedback means responsive to said plurality of magnetic field transducing means for providing analog feedback to said magnetic flux pickup means for maintaining the total magnetic flux provided to said plurality of magnetic field transducing means substantially constant.

13. The antenna apparatus as recited in claim 12 wherein said feedback means includes a source of magnetic flux for providing magnetic flux to said magnetic flux pickup means.

14. The antenna apparatus recited in claim 12 wherein said feedback means includes a source of current connected to said magnetic flux pickup means.

15. The antenna apparatus of claim 12 wherein a portion of the plurality of magnetic field transducing means comprise superconducting quantum interference devices (SQUIDs).

16. An active antenna for detecting the magnetic field component of applied electromagnetic radiation wherein the magnetic field component provides an applied magnetic flux, comprising:

a plurality of DC SQUIDs serially coupled in an array and producing an output signal in response to the applied electromagnetic radiation;

a magnetic transformer having a large area coil coupled to a small area coil, said large area coil receiving the applied magnetic flux and distributing the received magnetic flux to said small area coil, said small area coil being inductively coupled to each DC SQUID for transferring the received magnetic flux to each DC SQUID; and feedback means for providing magnetic flux to said magnetic transformer, said feedback means being responsive to the output signal from said array to maintain the total magnetic flux provided to said array substantially constant.

17. The antenna as recited in claim 16 wherein said feedback means further comprises:

a current source including an output node coupled to said array of said plurality of DC SQUIDs;

a resistor having first and second leads, said first lead being coupled to said output node of said current source; and an inductor having first and second leads, said first lead of said inductor being coupled to said second lead of said resistor and said second lead of said inductor being coupled to a reference potential, said inductor being inductively coupled to said magnetic transformer.

18. The antenna as recited in claim 16 wherein said feedback means further comprises:

a current source, said current source including an output node coupled to said array of said plurality of DC SQUIDs; and a resistor having first and second leads, said first lead being coupled to said output node of said current source, said second lead being coupled to said magnetic transformer.

19. An active antenna for detecting the magnetic field component of applied electromagnetic radiation, comprising:

a plurality of active DC SQUIDs, each SQUID producing electrical energy indicative of the magnitude of the magnetic component of the applied electromagnetic radiation, the SQUIDs being electrically coupled together in a multidimensional array, having an array perimeter, to combine electrical energy produced by each SQUID;

a plurality of dummy SQUIDs serially electrically coupled to said plurality of active DC SQUIDs, interspersed with the active DC SQUIDs, and positioned at said array perimeter, the arrangement of dummy SQUIDs ensuring substantially uniform magnetic flux over each active DC SQUID in the array, each dummy SQUID being nonresponsive to the applied electromagnetic radiation; and bias means, coupled to the array and the dummy SQUIDs for providing a substantially constant current to the array.

20. The antenna as recited in claim 19 wherein said DC SQUIDs and the dummy SQUIDs are serially coupled in said array, wherein the bias means includes:

current source means for providing the current to the array; and wherein the antenna further comprises means for measuring the voltage generated by the array.

21. A method for achieving an electrically small, ultrawideband, high dynamic range, active antenna, comprising the steps of:

distributing magnetic flux provided by the magnetic component of applied electromagnetic radiation over a plurality of magnetic field transducing devices wherein each magnetic field transducing device is constructed to provide an electrical signal output indicative of the magnetic component;

combining the electrical signal of each magnetic field transducing device to provide a combined output antenna signal; and controlling the total magnetic flux to the magnetic field transducing devices in response to monitoring the combined output antenna signal.

22. The method as recited in claim 21, further including the substeps of:

collecting the magnetic flux of the electromagnetic radiation over a larger first area and focusing the collected magnetic flux over a smaller second area; and distributing the magnetic flux focused over the second area to the plurality of magnetic field transducing devices.

23. The antenna of claim 16 wherein the feedback means further comprises:

a current source, including an output node coupled to the array of SQUIDs;

a first RF filter connected in series to the output node;

an amplifier connected in series to the first RF filter;

a second RF filter connected in series to the amplifier and coupled to the magnetic flux transformer, wherein the filters and amplifier provide increased feedback gain.

24. The antenna of claim 19 further comprising:

a current source, including an output node coupled to the array of SQUIDs;

a first RF filter connected in series to the output node;

an amplifier connected in series to the first RF filter;

a second RF filter connected in series to the amplifier and coupled to the magnetic flux transformer, wherein the filters and amplifier provide increased feedback gain.

25. The antenna apparatus of claim 9 wherein the feedback means includes means for increasing the feedback gain.

26. The antenna apparatus of claim 25 wherein the means for increasing feedback gain comprises:

a current source, including an output node coupled to the array;

a first RF filter connected in series to the output node;

an amplifier connected in series to the first RF filter;

a second RF filter connected in series to the amplifier and coupled to the array.

27. An active antenna having high linear dynamic range of at least about 250 dB and a bandwidth within this linear dynamic range from about DC to microwave frequencies, comprising:

(a) an array of serially connected, superconducting magnetic flux transducers for receiving applied magnetic flux from incident electromagnetic radiation and for producing an electrical signal corresponding to the magnetic flux at an output;

(b) a current source for supplying a substantially constant bias current to the transducers; and (c) a plurality of dummy elements intermittently serially coupled with the transducers and arranged so that the transducers each are subjected to substantially the same applied magnetic flux environment, each dummy element creating magnetic flux from the bias current but being nonresponsive to the applied magnetic flux.

28. The antenna of claim 30 further comprising a feedback loop inductively coupled to each transducer and being responsive to the output electrical signal of the array.

29. The antenna of claim 30 further comprising an amplifier electrically coupled to the output of the array.

30. The antenna of claim 31 further comprising a feedback loop electrically coupled to the amplifier and inductively coupled to each transducer, the loop being responsive to the output signal of the array.

31. The antenna of claim 27 wherein the array is an N×K, two dimensional, planar array and wherein the dummy elements are arranged on the perimeter of the array.

* * * * *